United States Patent [19]
Choquette

[11] Patent Number: 5,345,462
[45] Date of Patent: Sep. 6, 1994

[54] SEMICONDUCTOR SURFACE EMITTING LASER HAVING ENHANCED POLARIZATION CONTROL AND TRANSVERSE MODE SELECTIVITY

[75] Inventor: Kent D. Choquette, Albuquerque, N. Mex.

[73] Assignee: AT&T Bell Laboratories, Murray Hill, N.J.

[21] Appl. No.: 37,867

[22] Filed: Mar. 29, 1993

[51] Int. Cl.$^5$ .................................................. H01S 3/19
[52] U.S. Cl. ........................................ 372/45; 372/46; 372/96; 372/99
[58] Field of Search ......................... 372/45, 46, 96, 99

[56] References Cited

U.S. PATENT DOCUMENTS

| | | | |
|---|---|---|---|
| 4,949,350 | 8/1990 | Jewell et al. | 372/45 |
| 4,949,351 | 8/1990 | Imanaka | 372/45 |
| 5,115,441 | 5/1992 | Kopf et al. | 372/45 |
| 5,226,053 | 7/1993 | Cho et al. | 372/45 |

OTHER PUBLICATIONS

C. J. Chang-Hasnain, et al. "Polarization characteristics of quantum well vertical cavity surface emitting lasers," Electron. Lett. vol. 27, p. 163 (1991)-Jan.

T. Mukaihara, et al. "Stress effect for polarization control of surface emitting lasers", Electron. Lett. vol. 28, p. 555, (1992)-Mar.

M. Shimuzi, et al. "Polarization control for surface emitting lasers," Electron. Lett. vol. 27, p. 1067 (1991)-Jun.

T. Mukaihara, et al. "Engineered polarization control of GaAs/AlGaAs surface emitting lasers by anisotropic stress from elliptical etched substrate hole," Photon. Tech. Lett. vol. 5, p. 133 (1993)-Feb.

A. Chavez-Pirson, et al. "Polarization properties of a vertical-cavity surface emitting laser using a fractional layer superlattice gain medium", Appl. Phys. Lett. vol. 62, p. 3082 (1993)-Jun.

P. L. Gourley, et al. "High-efficiency TEM sub 00 cw epitaxial surface-emitting lasers and effect of half-wave periodic gain", Appl. Phys. Lett. vol. 54, p. 1209 (1989)-Mar.

C. J. Chang-Hasnain, et al. "Transverse mode characteristics of vertical-cavity surface emitting lasers," Appl. Phys. Lett. vol. 57, p. 218 (1990)-Jul.

M. Mori, et al. "Effect of cavity size on lasing characteristics of a distributed Bragg reflector surface emitting laser with buried heterostructure", Appl. Phys. Lett. vol. 60, p. 21 (1992)-Jan.

R. A. Morgan, et al. "Transverse mode control of vertical-cavity top surface emitting lasers," Photon. Tech. Lett. vol. 4, p. 374 (1993)-Apr.

*Primary Examiner*—Georgia Y. Epps
*Attorney, Agent, or Firm*—Glen E. Books

[57] ABSTRACT

Applicant has demonstrated that by appropriately shaping the laser gain region one can control the polarization direction of semiconductor vertical cavity lasers and enhance their transverse mode selectivity. Specifically, configuring the transverse cross section to regions have a length-to-width ratio in excess of 1.2 favors emission with polarization in the long dimension at the fundamental mode. A cruciform structure favors emission with switchable orthogonal polarization. The transverse shape can be configured by dry etching a particular cavity shape in index guided lasers or by forming a shaped ion implantation region around gain guided lasers.

6 Claims, 3 Drawing Sheets

SEMICONDUCTOR SURFACE EMITTING LASER HAVING ENHANCED POLARIZATION CONTROL AND TRANSVERSE MODE SELECTIVITY

FIELD OF THE INVENTION

This invention relates to semiconductor lasers and, in particular, to a semiconductor vertical cavity laser having enhanced polarization control and transverse mode selectivity. A polarization switching lair is also described.

BACKGROUND OF THE INVENTION

Semiconductor lasers are attractive for a wide variety of applications including telecommunications, computing systems, optical recording systems and optical connection of integrated circuits. Semiconductor lasers provide a compact source of coherent, monochromatic light which can be modulated at high bit rates to transmit large amounts of information.

Vertical cavity surface emitting lasers (VCSELs) are particularly promising for applications requiring two dimensional arrays of lasers. As contrasted with edge emitting lasers which emit light parallel to the growth planes of their substrates, VCSELs emit light perpendicular to their substrates. A typical VCSEL comprises an active region sandwiched between a pair of distributed Bragg reflector stacks. Upon injection of suitable current through the active region, laser light is emitted perpendicular to the planes of growth.

One difficulty with conventional VCSELs is the absence of polarization control and selectivity for transverse optical modes. As contrasted with edge emitting lasers which have long cavity lengths (100–500μm) and narrow stripe widths (1–10 μm), VCSELs typically have short cavity lengths (200–500 μm) and relatively large transverse circular areas (10–20 μm diameters). The polarization of emitted light is typically defined by accidental fabrication anisotropy and can vary from device to device, even in arrays. Moreover the lasers produce higher order transverse optical output at modest output power and multimode output at high power. The presence of higher modes, however, introduces mode competition noise into the optical output and complicates coupling to optical fiber. Accordingly, there is a need for a vertical cavity laser having enhanced polarization control and transverse mode selectivity.

SUMMARY OF THE INVENTION

Applicant has demonstrated that by appropriately shaping the laser gain region one can control the polarization direction of semiconductor vertical cavity lasers and enhance their transverse mode selectivity. Specifically, configuring the transverse cross section to regions have a length-to-width ratio in excess of 1.2 favors emission with polarization in the long dimension at the fundamental mode. A cruciform structure favors emission with switchable orthogonal polarization. The transverse shape can be configured by dry etching a particular cavity shape in index guided lasers or by forming a shaped ion implantation region around gain guided lasers.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and, except for graphical illustrations, are not to scale.

DETAILED DESCRIPTION

Figure 1:
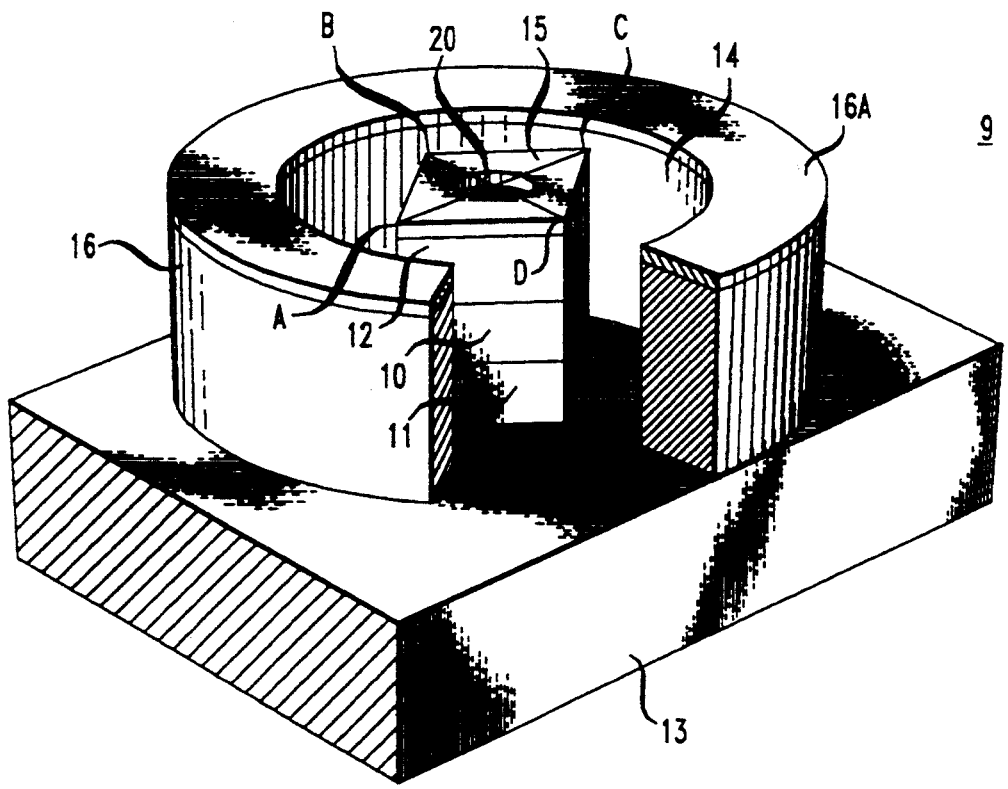
FIG. 1 is a schematic perspective view of a surface emitting laser in accordance with the invention.

Referring to the drawings, FIG. 1 is a perspective view of a surface emitting laser 9 whose active area has been configured into a rhomboidal (diamond) shape ABCD. In longitudinal cross section, laser 9 comprises in essence an active region 10 disposed between a pair of distributed Bragg reflector stacks 11 and 12. The structure is fabricated on a semiconductor substrate 13 such as n-type gallium arsenide. The inner reflector stack 11 comprises a periodic sequence of layers such as layers of aluminum gallium arsenide and aluminum arsenide. Advantageously, the layers of inner stack 11 are doped with the same type impurity as the substrate. The active region 10 can comprise alternating barrier layers and quantum well layers such as alternating layers of aluminum gallium arsenide and gallium arsenide. Alternatively, the active region can be a GaAs heterostructure. The outer reflector stack 12 is made up of periodic layers such as p-type aluminum gallium arsenide and aluminum arsenide. Regions 14 peripheral to the active region 10 are either etched away (as shown) or rendered highly resistive by proton implantation (not shown). Ohmic contact 15 is made to the outer stack 12 and a second ohmic contact (not shown) is made to substrate 13 in order to provide current to the active region 10.

In accordance with the invention, the active region is configured to control the direction of polarization and to favor a desired transverse optical mode. The active region is shaped in transverse cross section to provide a major dimension exceeding a perpendicular minor dimension by a factor of 1.2 or more. Specifically, FIG. 1 shows a metallized top contact 15 covering the rhomboidal active area ABCD. Diagonal AC exceeds diagonal BD by a factor of 1.2 or more. An opening 20 is provided in contact 15 to permit optical emission.

A more precise description of the desired shape of the active area is to choose the major dimension as the longest line segment passing through the center of the active area in transverse cross section. The minor dimension is then the longest line segment in the transverse cross section perpendicular to the major dimension. As applied to the FIG. 1 embodiment, the long diagonal AC passes through the center of the active area and the short diagonal BD is the longest line perpendicular to AC.

Advantageously an integral photodiode 16 with contact 16A can be formed substantially peripherally surrounding the laser to provide a detector for laterally emitted light. As will be shown, the lateral emission provides information concerning threshold and internal transition rates useful in monitoring and controlling the laser.

In operation, voltage applied between contact 15 and the substrate contact produces a current which is channeled through the rhomboidal active region 10 underlying contact 15. Light generated in the active region is reflected between stacks 11 and 12, and a portion of the light is emitted through window 20. Because of the shape of the active region, the light emitted is preferentially disposed in a low order mode and polarized in the direction of the major dimension AC.

Figure 2:
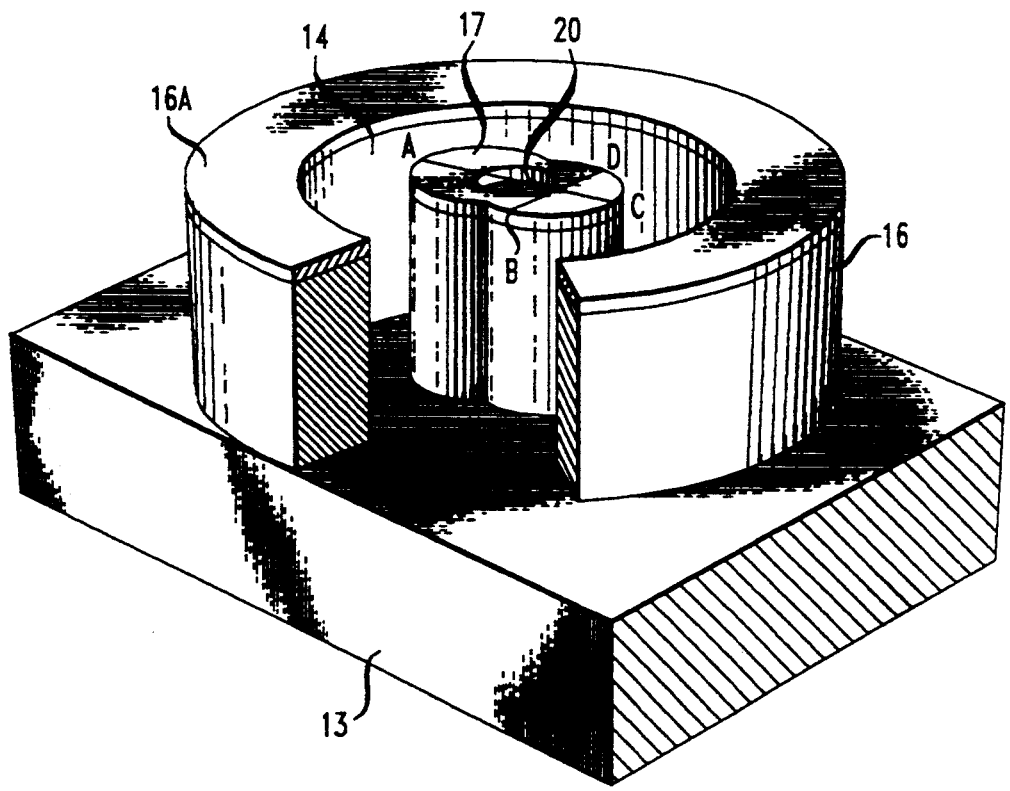
FIG. 2 is an alternative embodiment of a surface emitting laser.

FIG. 2 is a second embodiment of a surface emitting laser wherein the transverse area 17 is configured in a "dumbell" shape comprising a pair of intersecting circles. Here the major dimension AC is along the line connecting the centers of the two circles (extending to their circumferences). It exceeds by a factor of 1.2 or more the minor dimension BD comprising a circle diameter. The device is made in substantially the same manner as that described in connection with FIG. 1 except that the active area has the transverse configuration depicted. Emission from this device is preferentially in the fundamental $TE_{10}$ mode.

Figure 3:
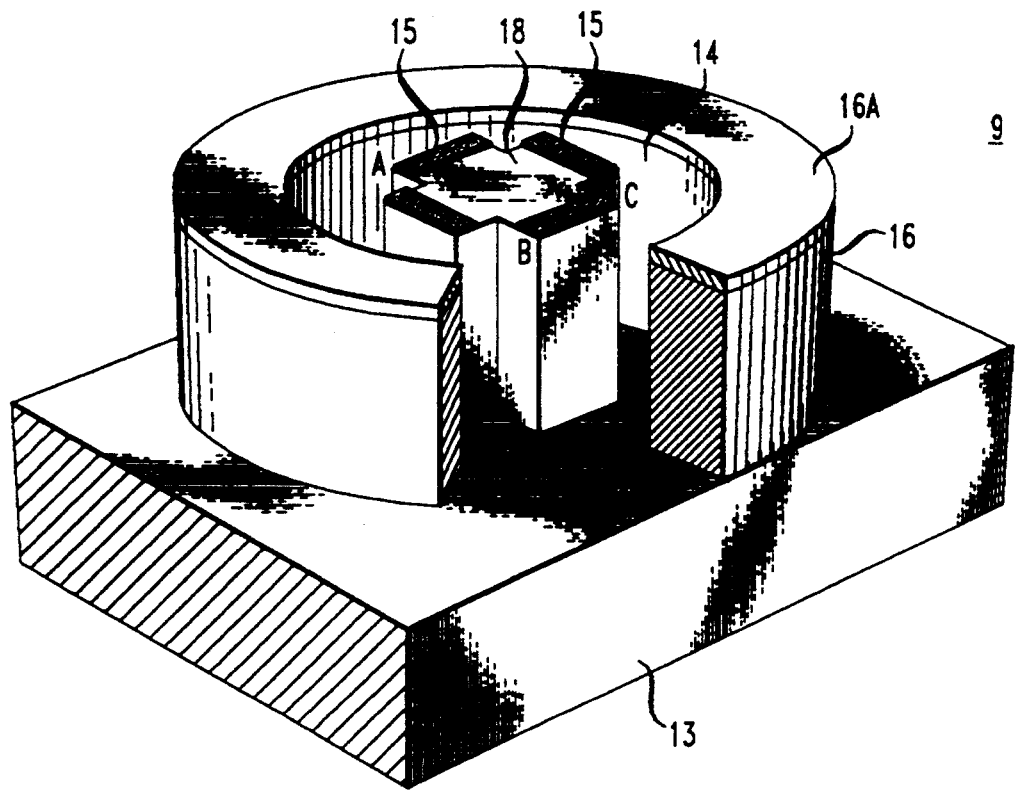
FIG. 3 is a polarization switching laser.

FIG. 3 is a perspective view of a polarization switching laser in accordance with the invention comprising a surface emitting laser wherein the transverse area 18 is configured in a cruciform (cross) shape which can be thought of as a pair of rectangles intersecting at 90°. Each rectangle has a major dimension (i.e. length AB ) exceeding by a factor of 1.2 its minor dimension (i.e. width BC). Each rectangle is provided with ohmic contacts 15 at each end of the major dimension.

In operation voltage is switchably applied to one rectangle or the other. This produces a light output which is polarized along the major dimension of the rectangle to which the voltage is applied. By switching the voltage from one rectangle to the other the polarization is switched 90°. Emission from this device is preferentially in the $TE_{11}$ mode.

The structure, fabrication and operation of the invention can be understood in greater detail by consideration of the following specific examples. A plurality of surface emitting lasers were grown on n-doped gallium arsenide 13 using the MBE process to grow the sequence of layers comprising the FIG. 1 structure, including the inner reflector stack 11, the quantum well active region 10, and the upper reflector stack 12.

The inner reflector stack 11 was fabricated by growing a staircase distributed Bragg reflector comprising twenty-nine periods of layers. Each period consists of 515Å of $Al_{.16}Ga_{.84}As$, 99 of $Al_{.58}Ga_{.42}As$, 604 of AlAs, and 99 of $Al_{.58}Ga_{.42}As$. The AlGaAs layers are doped with n-type impurity, e.g. silicon, to a concentration of $3 \times 10^{18} cm^{-3}$.

The active region 10 was grown by MBE on the lower reflector stack 11. As a preliminary step, a spacer layer of $Al_{.16}Ga_{.84}As$ was grown on stack 11. The thickness of the spacer layers is preferably chosen so that the central antinode of standing waves will overlap the quantum wells. In this example, the thickness is about 890. The quantum well region on the spacer layer comprises five quantum wells consisting of 70 well layers of GaAs and 70 barrier layers of $Al_{.16}Ga_{.84}As$. A second 890 $Al_{.16}Ga_{.84}As$ spacer layer was grown over the region. The two spacer layers sandwich the quantum well active region to form a confinement heterostructure for efficient carrier trapping.

The upper reflector stack 12 was grown on the quantum well active region 10, and in particular, on the upper spacer layer of region 10. The upper stack 12 is similar to the lower stack 10 except that stack 12 is p-doped and contains fewer periods than stack 11 so that light will be emitted. Specifically, stack 12 can be doped with Be to a concentration of $3 \times 10^{-18} cm^{-3}$ near the active region increasing to $2 \times 10^{19}$ at the surface. It comprised 20 periods.

After material growth, the metal contact layers 15 and 16A were applied and patterned into several transverse configurations by the conventional lift-off process. These included a conventional circular configuration and the configurations shown in FIGS. 1, 2 and 3. The preferred contact layer was a 200 nm thick film of Au/Ti/AuBe.

After contact configuration, a layer of $SiO_2$ was deposited by plasma-enhanced chemical vapor deposition, to a thickness of about 3000, and was patterned to cover the laser windows 20 (and 18 of the cross-shaped device). The structure was then subjected to dry etching by reactive ion etching using $SiCl_4$ at a pressure of $5 \times 10^{-3}$ Torr and radio frequency power of 160mW/cm² at 13.56 MHz to etch completely through the epilayers to a depth of about 7.0μm. The gain region transverse area for each laser structure-circular, rhomboidal, dumbell and cruciform was approximately 320μm². This process conveniently forms monolithic photodiodes 16 simultaneously with the formation of the lasers.

Samples were mounted with indium solder to a copper block. Axial emission was measured from the top surface under cw excitation. Simultaneously spontaneous lateral emission was measured from the photocurrent of the surrounding photodiodes.

FIGS. 4, 5, 6 and 7 are plots of the axial and lateral light intensity as functions of the drive current for a conventional circular configuration laser and the devices of FIGS. 1, 2 and 3, respectively. (The cruciform device did not have separated electrodes as shown in FIG. 3 but rather had a single electrode with a hole for light emission similar to FIGS. 1 and 2). The substrate temperature was at 180° K. Since each of the devices had its own photodetector, the vertical scales are not directly comparable.

Figure 4:
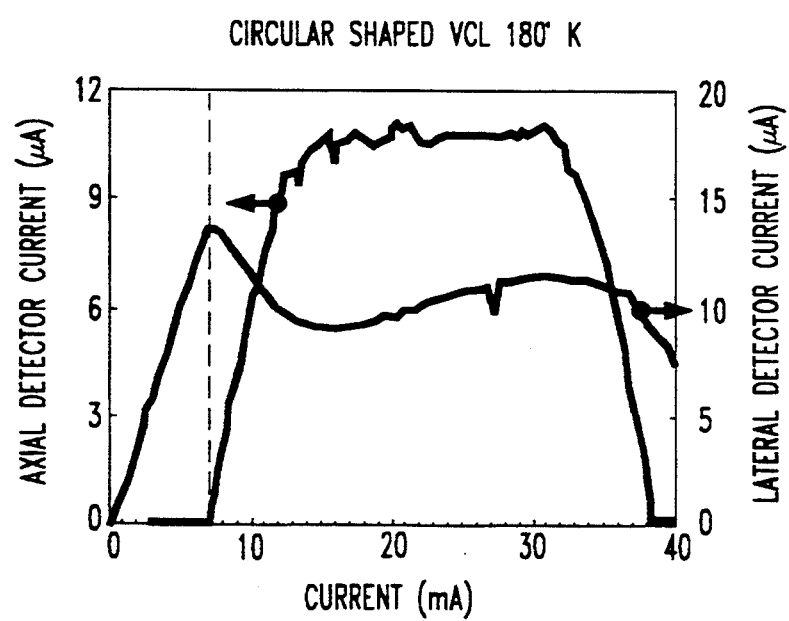
FIGS. 4, 5, 6, and 7 are plots of the axial and lateral light intensity versus drive current for surface emitting lasers having several configurations of transverse active area.
Figure 5:
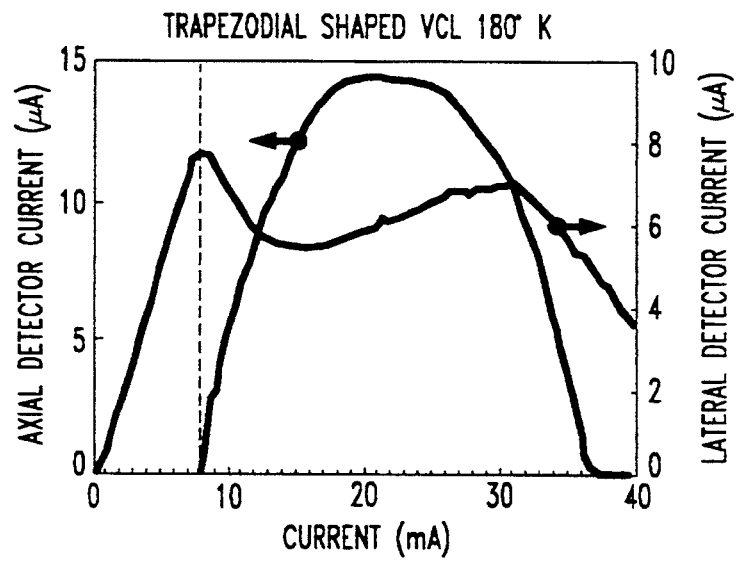
Figure 6:
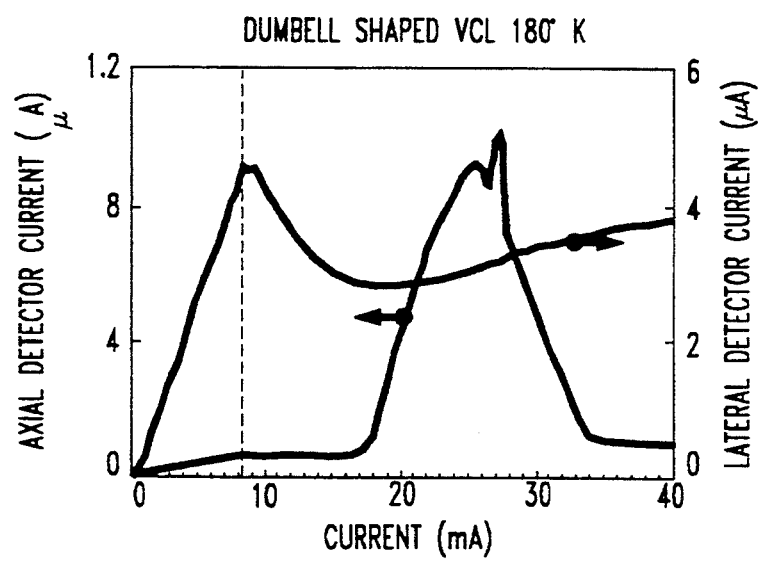
Figure 7:
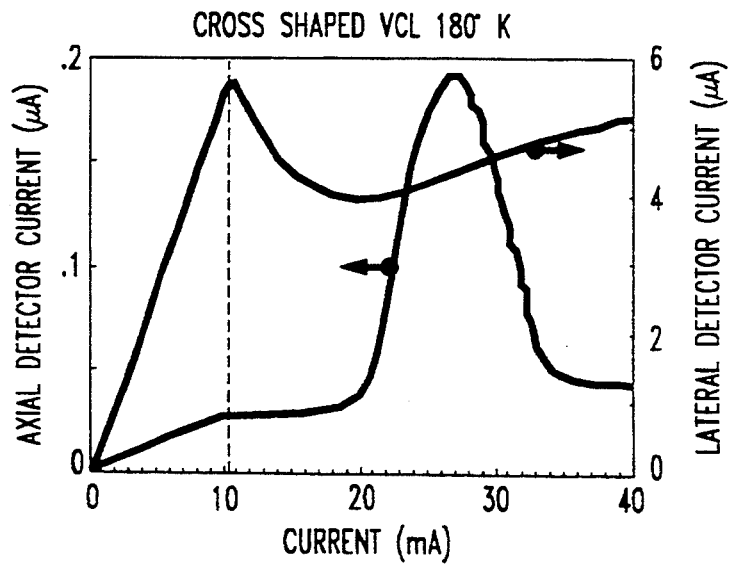

As can be seen, for example, in FIG. 4, the laser threshold current $I_{th}$ can be identified from the slope change in the lateral detector photocurrent. It is identified by a dotted vertical line. The lateral photocurrent also indicates the internal transition rates. It can be noted that the axial emission of the circular laser (FIG. 4) exhibits significantly greater noise as compared to the lasers of FIGS. 1, 2 and 3. This difference in noise is attributed to the enhanced transverse mode selectivity of the FIG. 1, 2 and 3 structures.

It is to be understood that the above-described embodiments are illustrative of only a few of the many possible specific embodiments which can represent applications of the principles of the invention. Numerous and varied other arrangements can be made by those skilled in the art without departing from the spirit and scope of the invention.

I claim:

1. In a semiconductor vertical cavity laser of the type comprising a transversely configured active region longitudinally sandwiched between a pair of reflecting layers, said active region having a transverse cross section with a center, the improvement wherein said transversely configured active region has a major dimension constituting the longest line segment in said region passing through said center and a minor dimension constituting the longest line segment perpendicular to said major dimension in said region, said major dimension exceeding said minor dimension by a factor of 1.2 or more.

2. A laser according to claim 1 wherein said active region has a rhomboidal shape having an associated pair of diagonals with said major dimension along one diagonal and said minor dimension along the other diagonal.

3. A laser according to claim 1 wherein said active region has a dumbell shape comprising two intersecting circles with said major dimension along the line between the centers of said circles and said minor dimension along a diameter of one of said circles.

4. A laser according to claim 1 comprising a pair of configured active regions intersecting in a cruciform shape.

5. A polarization switching semiconductor vertical cavity laser comprising a semiconductor active region longitudinally sandwiched between a pair of reflecting layers, said semiconductor active region transversely configured into a plurality of intersecting regions, each said region having a transverse cross section with a center and each said region having a major dimension constituting the longest line segment in said region passing through said center and a minor dimension constituting the longest line segment perpendicular to said major dimension in said region, said major dimension exceeding said minor dimension by a factor of 1.2 or more, and each said region having separate electrode means.

6. A laser according to claim 1 or 2 or 3 or 4 or 5 further comprising a photodiode extending peripherally around said active region.

* * * * *